United States Patent [19]

Kato et al.

[11] 4,011,653
[45] Mar. 15, 1977

[54] METHOD FOR MANUFACTURING A SEMICONDUCTOR INTEGRATED CIRCUIT INCLUDING AN INSULATING GATE TYPE SEMICONDUCTOR TRANSISTOR

[75] Inventors: Taketoshi Kato, Yokohama; Norio Kobayashi, Yokosuka, both of Japan

[73] Assignee: Tokyo Shibaura Electric Co., Ltd., Kawasaki, Japan

[22] Filed: July 25, 1975

[21] Appl. No.: 598,758

Related U.S. Application Data

[63] Continuation-in-part of Ser. No. 409,721, Oct. 25, 1973, abandoned, which is a continuation-in-part of Ser. No. 282,567, Aug. 21, 1972, abandoned.

[30] Foreign Application Priority Data

Aug. 23, 1971  Japan .............................. 46-63649

[52] U.S. Cl. .................................. 29/571; 29/577; 29/578; 29/580; 357/41
[51] Int. Cl.² .................................. B01J 17/00
[58] Field of Search ............ 29/571, 577, 578, 580; 357/41

[56] References Cited

UNITED STATES PATENTS

| 3,475,234 | 10/1969 | Kerwin | 29/571 |
| 3,504,430 | 4/1970 | Kubo | 29/578 |
| 3,550,256 | 12/1970 | Deal | 29/571 |
| 3,752,711 | 8/1973 | Kooi | 29/571 |

*Primary Examiner*—W. Tupman
*Attorney, Agent, or Firm*—Flynn & Frishauf

[57] ABSTRACT

A method for manufacturing a semiconductor integrated circuit having insulating gate type semiconductor transistors and protective insulators formed on one side of a semiconductor substrate, the semiconductor elements being connected to each other through electrodes mounted on said protective insulators, wherein those portions of the surface of the substrate which are positioned right under said electrodes are further provided with layers having the same conductivity type as, but higher concentrations of impurities than, said substrate in order to prevent the occurrence of parasitic MOS and in consequence current leakage across said transistors.

6 Claims, 12 Drawing Figures

METHOD FOR MANUFACTURING A SEMICONDUCTOR INTEGRATED CIRCUIT INCLUDING AN INSULATING GATE TYPE SEMICONDUCTOR TRANSISTOR

CROSS-REFERENCE TO RELATED APPLICATION

This application is a continuation-in-part application of Ser. No. 409,721, filed oct. 25, 1973, now abandoned, which in turn was a continuation-in-part application of Ser. No. 282,567, filed Aug. 21, 1972 and now abandoned.

BACKGROUND OF THE INVENTION

This invention relates to a method for manufacturing a semiconductor integrated circuit and more particularly a semiconductor device including insulating gate type semiconductor transistors as active elements.

To date, there has been known a semiconductor integrated circuit prepared by incorporating a plurality of active elements in a semiconductor substrate and connecting them to electrodes. Heretofore, a transistor used as an active element more favorably consists of an insulating gate type which is easy to manufacture than a bi-polar type. This insulating gate type semiconductor transistor includes spatially formed source and drain regions, a gate insulating layer deposited on that part of the substrate surface which is defined between said source and drain regions and a member mounted on said gate insulating layer so as to constitute a channel between said source and drain regions. A semiconductor transistor wherein said channel forming member consists of metals is known as a metal insulator semiconductor transistor (MIS-transistor). Among said MIS-transistors, the type wherein the insulator is formed of an oxide layer is referred to as a metal oxide semiconductor transistor (MOS-transistor). Another semiconductor transistor wherein the aforesaid channel member is made of silicon s called a silicon gate transistor.

The above-mentioned semiconductor substrate is covered for protection and separation of the active elements with insulators excluding those parts of the substrate surface where there are formed the aforesaid active elements or semiconductor elements. These semiconductor elements are electrically connected together by electrodes mounted on the insulators.

When the prior art semiconductor integrated circuit of the above-mentioned construction is operated, namely when electric current flows through the electrodes, there is undesirably formed due to the so-called parasitic MOS effect a low resistance layer or reversed layer on those parts of the substrate surface which are positioned right under said electrodes. This even causes current to leak easily through said parts, resulting in the deterioration of the electric properties of said active elements on their short-circuiting. To eliminate said parasitic MOS effect, attempts have been made to use a thicker protective insulator right under each electrode. Even this process has failed to reliably prevent the occurrence of current leakage. Since, in this case, the transistor should have a low threshold voltage, it is necessary to reduce the thickness of the gate insulator as much as possible. As the result, both protective insulators and gate insulators are required to have widely varying thickness, presenting difficulties in their manufacture. Further there most likely takes place the breakage of electrodes at the stepped portions between both insulators while or after said electrodes are formed.

It is accordingly the object of this invention to provide a method for manufacturing a semiconductor integrated circuit which is saved from the occurrence of a leak path on those parts of the substrate surface which are disposed right under the electrodes connecting an insulating gate type transistor and other active elements without the necessity of particularly broadening the thickness of insulators interposed between said electrodes and substrate surface.

SUMMARY OF THE INVENTION

According to an aspect of this invention there is provided a method for manufacturing a semiconductor integrated circuit comprising the steps of forming an insulating layer on a semiconductor substrate of one conductivity type, etching the insulating layer to expose the part of the substrate and to leave separate parts on the substrate where gate insulators are to be formed, diffusing impurities into the substrate from the exposed surface thereof to form a current leakage preventing layer of the same conductivity type as and higher concentration than the substrate, forming an insulating layer on the exposed surface of the substrate, etching the insulating layer to expose the surface portions of the substrate, diffusing impurities from the exposed portions into the substrate to form source and drain regions of at least two field effect transistors, the current leakage preventing layer surrounding the transistors and contacting the regions of the transistors, etching the part of the insulating layer between and on the part of the source and drain regions of each transistor to form an opening exposing the surfce part of the substrate having the same dimensions as the separate regions, forming a gate insulator on the exposed surface part between the source and drain regions, and forming a gate electrode on the gate insulator.

The term "insulating gate type semiconductor transistor", as used herein, is defined to mean a transistor such as a MIS-transistor, MOS-transistor or silicon gate transistor wherein there is formed a gate channel below an insulator with this type of transistor. The source and drain region may be formed horizontally parallel, or the drain region may be so disposed as to surround the source region at a prescribed interval. Further, it will be apparent that the aforementioned current leakage preventing layer is of $N^+$ conductivity type where the semiconductor substrate is of N conductivity type, and of $P^+$ conductivity type where said substrate is of P conductivity type. Said current leakage preventing layer is preferred to have a smaller thickness than the source and drain regions, contain impurities at concentrations more than three times those in the semiconductor substrate, or preferably at concentrations ranging between $10^1$ and $10^3$ times.

BRIEF DESCRIPTION OF THE DRAWINGS

FIGS. 3A and 3B are curve diagrams indicating the relationship between threshold voltage of the transistors used in said circuit and the concentrations of impurities in the current leakage preventing layer wherein FIG. 3A represents the case where the semiconductor substrate is of P conductivity type and FIG. 3B the case where said substrate is of N conductivity type.

DETAILED DESCRIPTION OF THE INVENTION

There will now be described by reference to FIGS. 1A to 1H and FIGS. 2A and 2B a method for manufacturing a semiconductor integrated circuit according to an embodiment of this invention.

Figure 1A:
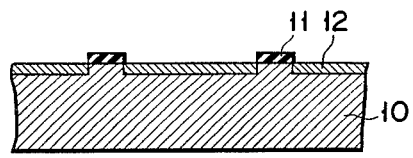
FIGS. 1A to 1G illustrate the sequential steps of manufacturing a semiconductor integrated circuit according to an embodiment of this invention, showing the sectional views at each step.
Figure 1B:
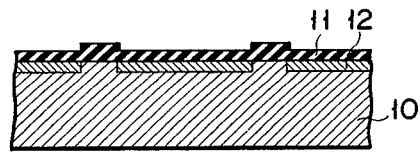
Figure 1C:
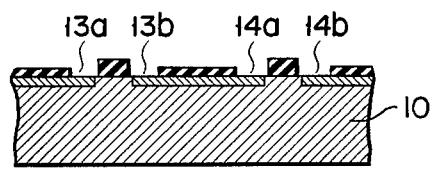
Figure 1D:
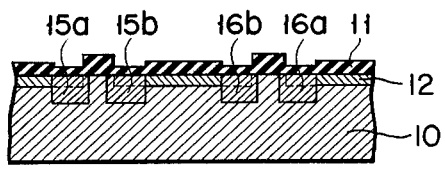
Figure 1E:
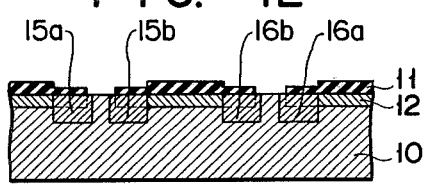
Figure 1F:
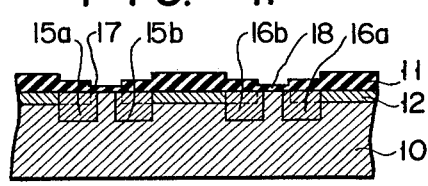
Figure 1G:
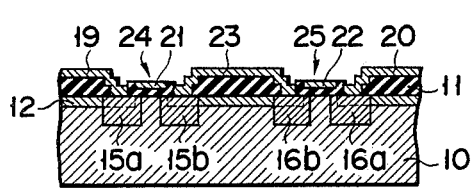
Figure 1H:
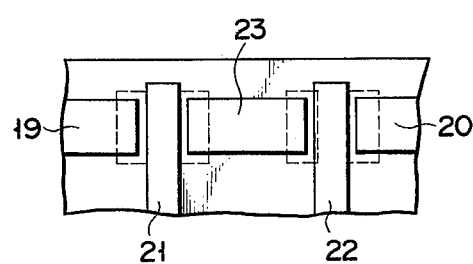
FIG. 1H is a plan view of FIG. 1F.
Figure 2A:
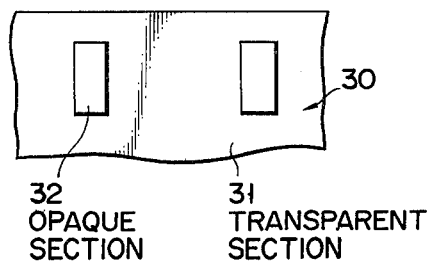
FIGS. 2A and 2B are plan views of mask plates used in the method of manufacturing a semiconductor integrated circuit according to the present invention.
Figure 2B:
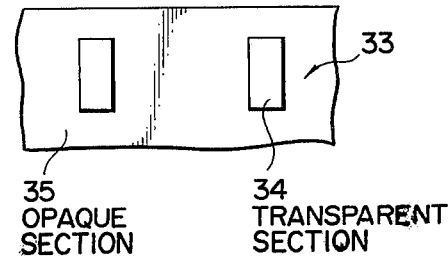

There is provided an N conductivity type silicon semiconductor substrate 10 having a specific resistance of 4.5 Ωcm. The surface of said substrate is coated with an insulating layer 11 of silicon dioxide by a high temperature oxidation process or a process of thermally decomposing silane. The insulating layer 11 is selectively photo-ethced to leave over two separate parallel regions. Such an etching process is made by forming a photosensitive film on the insulating layer 11, mounting a mask plate 30 having a desired pattern as shown in FIG. 2A on the photosensitive film, exposing and then developing the part of the photosensitive film according to the pattern of the mask plate and etching the part of the insulating layer 11 under the unexposed portion of the photosensitive film. The mask plate 30 has such a mask pattern that its transparent section 31 corresponds to the portion of the insulating film 11 which should be removed and its opaque section 32 represents the portion which should be i.e. two separate parallel regions. It is also possible to use a mask in which the above-mentioned transparent and opaque portions of the plate 30 serve as the opposite portions to those described above by using another conventional etching method. Through the exposed regions is diffused in the substrate an impurity of N conductivity type such as phosphorous or arsenic to form current leakage preventing layers 12 (FIG. 1A) of the same conductivity type as, but higher impurity concentration than, the semiconductor substrate. According to this embodiment, the current leakage preventing layer 12 has a surface impurity concentration of $1 \times 10^{16}$ cm$^{-3}$ and a diffusion depth of 1.0 micron, and said layers 12 of high impurity concentration are coated with the silicon dioxide layer 11 (FIG. 1B). Throughout the manufacturing steps of this embodiment, all the silicon dioxide layers or insulators are denoted by numeral 11. The insulating layer 11 is etched to form openings 13a, 13b, 14a and 14b through which to expose the substrate surface (FIG. 1C) so that the left portions of the insulator 11 between the openings 13a, 13b and between the openings 14a and 14b have a slightly smaller width than those of the insulator 11 shown in FIG. 1A. Of these openings, 13a and 13b constitute a pair, and 14a and 14b form another pair. The openings 13a and 14a are intended for formation of source regions and the other openings 13b and 14b for that of drain regions. As seen from FIG. 1C, said openings 13a, 13b, 14a and 14b expose not only the substrate surface, but also one edge portion of each current leakage preventing layer 12 of high impurity concentration. Next there is diffused in the substrate surface a P conductivity type impurity such as boron through the openings 13a and 14a to form P conductivity type source regions 15a and 16a and through the openings 13b and 14b to form P conductivity type drain regions 15b and 16b. As seen from FIG. 1D, by or after diffusion of said boron, the openings 13a, 13b, 14a and 14b are again coated with the silicon dioxide layer 11. The current leakage preventing layers of high impurity concentration whose edge portions are disposed in the source regions 15a and 16a and the drain regions 15b and 16b attain connection therewith. These source and drain regions are preferred to have a deeper depth and a higher impurity concentration than the current leakage preventing layers. According to this embodiment, they have a surface impurity concentration of $2 \times 10^{20}$ cm$^{-3}$ and a diffusion depth of 2.0 microns. Further, the silicon dioxide layers between the source and drain regions are etched to expose the underlayers by using a mask palte 33 as shown in FIG. 2B (FIG. 1E). On the underlayers thus exposed are deposited fresh thin silicon dioxide layers to form gate insulators 17 and 18 (FIG. 1F). The mask plate 33 has transparent and opaque sections 34, 35, the transparent section 34 designed to have the same dimensions as the opaque section 32 of the mask plate 30. That is, the second mask plate 33 has substantially the same mask pattern as said first mask plate 30 but with the transparent and opaque sections of said mask plates reversed with respect to each other. Said etching of the silicon dioxide layers between the source and drain regions can be easily effected due to freedom from displacement. That is, the gate insulators 17 and 18 are designed to have the same dimensions as the separate parallel regions of the insulating layer formed by the step shown in FIG. 1A. These gae insulators 17 and 18 should be made as thin as possible to reduce the threshold voltage of the transistor. According to this embodiment, they are as thin as 0.15 micron. Finally, all the silicon dioxide layers are fully coated with a metal layer, and then the metal layer is etched to form source electrodes 19 and 20, gate electrodes 21 and 22, and a common drain electrode 23, thereby providing two MOS-transistors 24 and 25 (FIGS. 1G and 1H). In this case, the source electrodes 19 and 20 are, of course, connected at one end to the source regions 15a and 16a, at the intermediate part to the surface of the silicon dioxide layers 11 and at the other end to another semiconductor element or lead wire (not shown). The gate electrodes 21 and 22 and common drain electrode 23 are similarly connected to the surfaces of the silicon dioxide layers 11. Right under those portions of the surfaces of the silicon dioxide layer or protective insulators 11 on which there are mounted all said source, gate and drain electrodes 19, 20, 21, 22 and 23, there is disposed, as seen from FIG. 1G, a part of each current leakage preventing layer 12 of high impurity concentration so formed on the surface of the semiconductor substrate as to surround the MOS-transistors 24, 25.

The gate electrode may be formed, instead of the aforementioned metal layer, of a polycrystalline silicon layer doped with impurities such as phosphorous and boron to increase its conductivity.

The semiconductor integrated circuit of this invention can be easily manufactured by the above-mentioned process. However, the manufacture is not limited to this process. For example, the source and drain regions may be formed prior to the current leakage preventing layers. Further, said leakage preventing layers may be deposited by the ion plantation process, epitaxial growth process or any others.

There will now be given two examples where there were prepared semiconductor integrated circuits of the type illustrated in FIGS. 1G and 1H. Comparison was made between the prior art integrated circuits and those of this invention in respect of the threshold voltage $V_{th}$ of the transistor and the withstand voltage $V_{DS}$ across the source and drain regions, the results being presented in Table 1 below.

EXAMPLE 1

| | |
|---|---|
| Semiconductor substrate | N conductivity type silicon having a specific resistance of 4.5 Ωcm |
| Separate insulator | Silicon dioxide layer 1.5 microns thick |
| Gate insulator | Silicon dioxide layer 0.15 micron thick |
| Source and drain regions | Formed by diffusing an impurity with a depth of 2.0 microns and at a surface concentration of $2 \times 10^{20}$ (cm$^{-3}$) |
| Current leakage preventing layers | Formed by diffusing an impurity with a depth of 1.0 micron and at a surface concentration of $1 \times 10^{16}$ (cm$^{-3}$) |

EXAMPLE 2

| | |
|---|---|
| Semiconductor substrate | N conductivity type silicon having a specific resistance of 4.5 Ωcm |
| Separate insulator | silicon dioxide layer 1.5 microns thick |
| Gate insulator | Silicon dioxide layer 1.5 microns thick |
| Source and drain regions | Formed by diffusing an impurity with a depth of 2.0 microns and at a surface concentration of $2 \times 10^{20}$ (cm$^{-3}$) |
| Current leakage preventing layers | Formed by diffusing an impurity with a depth of 1.0 micron and at a surface concentration of $1 \times 10^{16}$ (cm$^{-3}$) |

Note: Examples 1 and 2 differ from each other only in respect of the gate insulator.

Table 1

Comparison of the present and prior art integrated circuits

| Example (Present invention) | Threshold voltage ($V_{th}$) | Withstand voltage ($V_{DS}$) |
|---|---|---|
| 1 | 3.05 V | 40.5 V |
| 2 | 41 V | 40.3 V |
| Reference (Prior art) | | |
| 1a | 3.07 V | 40.4 V |
| 2a | 14.7 V | 42.2 V |

Note: The referential samples 1a and 2a represent the prior art circuits which were prepared under substantially the same conditions as those of this invention excepting that the prior art samples were not provided with a current leakage preventing layer.

Figure 3A:
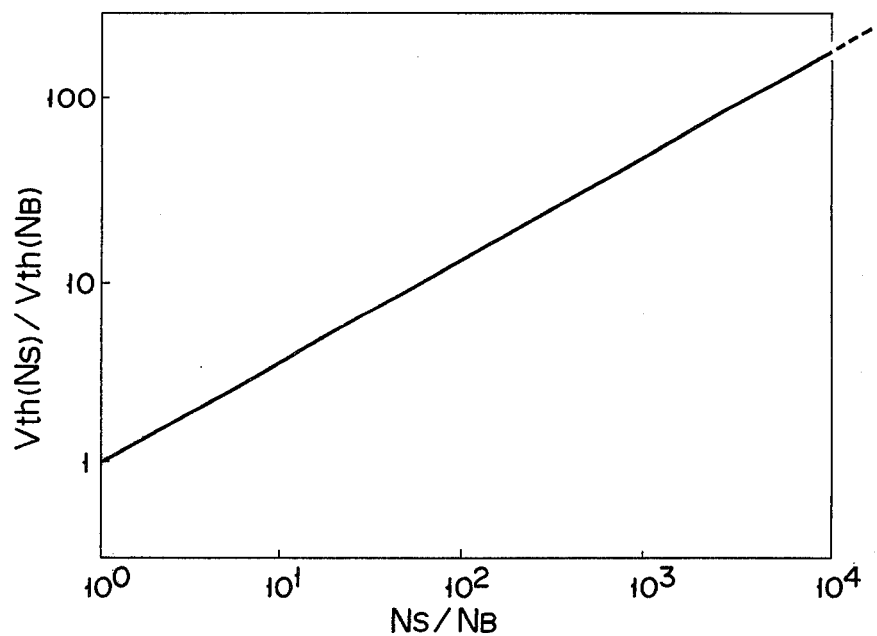
Figure 3B:
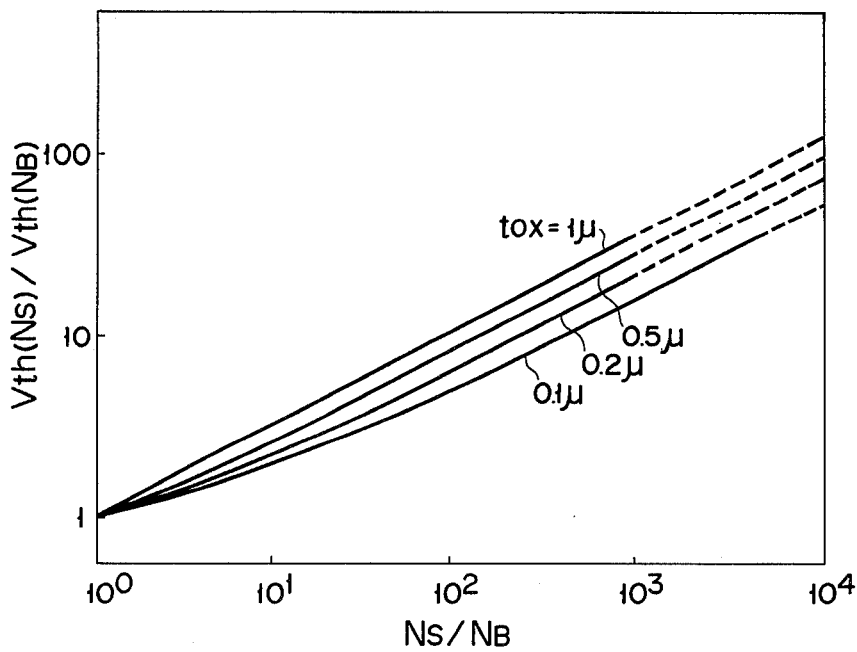

In the semiconductor integrated circuit of this invention, the threshold voltage between the transistor elements is elevated, as seen from Table 1 above, due to formation of layers of impurity at high concentrations on those parts of the surface of the semiconductor substrate which are disposed right under the separate oxide layers or insulators. FIGS. 3A and 3B present the experimentally determined relationship between the threshold voltage of the transistor and the concentration at which there was diffused an impurity. FIG. 3A represents the case where the semiconductor substrate was of P conductivity type and FIG. 3B the case where said substrate was of N conductivity type. The ordinates of these FIGS. 3A and 3B indicate the relationship between the threshold voltage ($V_{th}$ ($N_S$)) associated with the surface concentration of diffused impurity constituting a current leakage preventing layer and the threshold voltage ($V_{th}$ ($N_B$)) associated with the surface concentration of the semiconductor substrate. The abscissas of said FIGS. 3A and 3B show the relationship between the surface concentration ($N_S$) of said diffused impurity and the surface concentration ($N_B$) of said substrate. As apparent from FIGS. 3A and 3B, the higher the surface concentration of said diffused impurity, the more elevated the threshold voltage, and the ratio of $N_S$ to $N_B$ larger than 3 or preferably ranging between 10 and $10^3$ is particularly effective in application in order to obtain the relationship of $V_{th}$ ($N_S$)/$V_{th}$ ($N_B$) ≥ 2 which is considered to have a practical advantage. Where the semiconductor substrate is of P conductivity type, variation in the thickness of separate oxide layers as insulation results in little change in the threshold voltage. Conversely where the semiconductor substrate is of N conductivity type, any change in the thickness (tox) of said separate oxide layers as insulator leads to a corresponding variation in the threshold voltage.

What we claim is:

1. A method for manufacturing a semiconductor integrated circuit comprising the steps of:

forming a first insulating layer on a semiconductor substrate of one conductivity type;

etching, with a first mask plate having, a predetermined transparent and opaque mask pattern the insulating layer to expose a surface part of the substrate and to leave separated parts on the substrate where gate insulators are to be formed, said first mask plate having separated opaque sections corresponding to said separated parts on the substrate;

diffusing impurities into the substrate from the exposed surface thereof to form a current leakage preventing layer of the same conductivity type as and higher concentration than the substrate;

forming a second insulating layer on the exposed surface of the substrate;

etching the insulating layers to expose surface portions of the substrate;

diffusing impurities from the exposed surface portions into the substrate to form source and drain regions of at least two field effect transistors such that portions of said source and drain regions underlie said first insulating layer, the current leakage preventing layer surrounding the transistors and contacting the regions of the transistors;

etching, for each transistor and with a second mask plate having substantially the same mask pattern as said first mask plate but with the transparent and opaque portions of said mask plates reversed with respect to each other, the part of the first insulating layer between and on the part of the source and drain regions of each individual transistor to form for each transistor an opening exposing a surface part of the substrate having the same dimensions as said separated parts, said second mask plate being oriented relative to said substrate in substantially the same manner as said first mask plate such that the transparent portions of said second mask plate are aligned with the portions of said substrate that were aligned with the opaque portions of said first mask plate;

forming a gate insulator on the exposed surface part between the source and drain regions, the gate insulator also extending beyond the adjacent edges of the source and drain regions and being in at least partial overlapping relationship therewith; and forming a gate electrode on the gate insulator, the gate electrode being in at least partial overlapping relationship with the source and drain electrodes.

2. A method according to claim 1 wherein said gate insulator has a smaller thickness than the other insulator.

3. A method according to claim 1 wherein the member mounted on the gate insulator is a metal gate electrode.

4. A method according to claim 1 wherein the member mounted on the gate insulator is a polycrystalline silicon layer doped with impurities.

5. A method according to claim 1 wherein the current leakage preventing layer has a smaller thickness than the source and drain regions of the transistor.

6. A method according to claim 1 wherein said leakage preventing layer is formed with an impurity concentration more than three times than that of the substrate.

* * * * *